(12) United States Patent
Bhattacharyya et al.

(10) Patent No.: US 11,151,707 B2
(45) Date of Patent: Oct. 19, 2021

(54) SYSTEM AND METHOD FOR DIFFERENCE FILTER AND APERTURE SELECTION USING SHALLOW DEEP LEARNING

(71) Applicant: KLA-Tencor Corporation, Milpitas, CA (US)

(72) Inventors: Santosh Bhattacharyya, Milpitas, CA (US); Jacob George, Milpitas, CA (US); Saravanan Paramasivam, Chennai (IN); Martin Plihal, Pleasanton, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/277,769

(22) Filed: Feb. 15, 2019

(65) Prior Publication Data

US 2020/0184628 A1   Jun. 11, 2020

(30) Foreign Application Priority Data

Dec. 7, 2018   (IN) .............................. 201841046361

(51) Int. Cl.
*G06T 7/00* (2017.01)
*G06N 3/08* (2006.01)
(Continued)

(52) U.S. Cl.
CPC ....... *G06T 7/0004* (2013.01); *G01N 23/2251* (2013.01); *G06K 9/6253* (2013.01);
(Continued)

(58) Field of Classification Search
CPC . G06T 2207/30148; G06T 2207/20081; G06T 2207/20084; G06T 7/0004; G06T 7/0002; G06K 9/6253; G06K 9/6267
See application file for complete search history.

(56) References Cited

U.S. PATENT DOCUMENTS

| 7,602,962 B2 | 10/2009 | Miyamoto et al. |
| 9,922,269 B2 | 3/2018 | Venkataraman et al. |

(Continued)

FOREIGN PATENT DOCUMENTS

| WO | 2017136215 A1 | 8/2017 |
| WO | 2018165753 A1 | 9/2018 |

OTHER PUBLICATIONS

Mathieu, Michael, Mikael Henaff, and Yann LeCun. "Fast training of convolutional networks through ffts." arXiv preprint arXiv: 1312.5851 (2013). (Year: 2013).*

(Continued)

*Primary Examiner* — Li Liu
(74) *Attorney, Agent, or Firm* — Suiter Swantz pc llo

(57) ABSTRACT

A system for defect review and classification is disclosed. The system may include a controller, wherein the controller may be configured to receive one or more training images of a specimen. The one or more training images including a plurality of training defects. The controller may be further configured to apply a plurality of difference filters to the one or more training images, and receive a signal indicative of a classification of a difference filter effectiveness metric for at least a portion of the plurality of difference filters. The controller may be further configured to generate a deep learning network classifier based on the received classification and the attributes of the plurality of training defects. The controller may be further configured to extract convolution layer filters of the deep learning network classifier, and generate one or more difference filter recipes based on the extracted convolution layer filters.

38 Claims, 4 Drawing Sheets

(51) Int. Cl.
*G06N 3/04* (2006.01)
*G06K 9/62* (2006.01)
*G01N 23/2251* (2018.01)

(52) U.S. Cl.
CPC ......... *G06K 9/6256* (2013.01); *G06K 9/6262* (2013.01); *G06K 9/6267* (2013.01); *G06N 3/04* (2013.01); *G06N 3/08* (2013.01); *G01N 2223/646* (2013.01); *G06T 2207/10061* (2013.01); *G06T 2207/20081* (2013.01); *G06T 2207/20084* (2013.01)

(56) References Cited

U.S. PATENT DOCUMENTS

| | | | |
|---|---|---|---|
| 10,338,002 B1* | 7/2019 | Danen | H01L 22/20 |
| 2016/0189055 A1 | 6/2016 | Zvitia | |
| 2016/0379352 A1* | 12/2016 | Zhang | G06N 3/04 |
| | | | 382/157 |
| 2018/0075594 A1 | 3/2018 | Brauer | |
| 2018/0285493 A1 | 10/2018 | Huang et al. | |
| 2019/0206041 A1* | 7/2019 | Fang | G06T 7/001 |

OTHER PUBLICATIONS

Pan, Junting, et al. "Shallow and deep convolutional networks forsaliency prediction." Proceedings of the IEEE conference on computer vision and pattern recognition. 2016. (Year: 2016).*
Liu, Nian, et al. "Predicting eye fixations using convolutional neural networks." Proceedings of the IEEE Conference on Computer Vision and Pattern Recognition. 2015. (Year: 2015).*
International Search Report and Written Opinion dated Apr. 1, 2020 for PCT/US2019/064807.

* cited by examiner

SYSTEM AND METHOD FOR DIFFERENCE FILTER AND APERTURE SELECTION USING SHALLOW DEEP LEARNING

CROSS-REFERENCE TO RELATED APPLICATION

The present application claims priority to India Provisional Patent Application No. 201841046361, filed Dec. 7, 2018, entitled SHALLOW DL BASED DIFF FILTER AND APERTURE SELECTION, naming Santosh Bhattacharyya, Jacob George, Saravanan Paramasivam, and Martin Plihal as inventors, which is incorporated herein by reference in the entirety.

BACKGROUND

Two important factors for efficient defect review and classification are the selection of difference filters, and the selection of aperture settings used during image acquisition. Current systems and methods for selection of aperture settings typically utilize an "optics selector" software, in which a user selects a few defects or other areas of interest, and iteratively/exhaustively tests all possible aperture setting combinations. Experienced individuals may be capable of intuitively selecting and testing a smaller subset of aperture setting combinations. These iterative methods used to identify the best imaging aperture settings are often tedious and time consuming.

Similarly, current systems and method for selection of difference filters utilize two different methods: (1) pre-selected difference filter recipes, and (2) "algorithm selector" software. Under the pre-selected difference filter recipe method, a user may attempt to enhance defect signals by selecting one of a set of pre-defined difference filters obtained through a recipe. Under the "algorithm selector" method, algorithm selector software may estimate a difference filter to be used. Both methods of difference filter selection are primarily manual and intuition-based, and may therefore be prone to error. Additionally, even if a selected difference filter is optimized for a particular type of defect, current methods may not select a difference filter which is optimized for multiple types of defects. Thus, current methods of difference filter selection may be incompatible with multi-mode imaging/detection.

Therefore, it would be desirable to provide a system and method that cure one or more of the shortfalls of the previous approaches identified above.

SUMMARY

A system is disclosed, in accordance with one or more embodiments of the present disclosure. In one embodiment, the system includes a controller. In another embodiment, the controller is configured to receive one or more training images of a specimen, the one or more training images including a plurality of training areas of interest. In another embodiment, the controller is configured to apply a plurality of difference filters to the one or more training images. In another embodiment, the controller is configured to receive a signal indicative of a classification of a difference filter effectiveness metric for at least a portion of the plurality of difference filters. In another embodiment, the controller is configured to generate a deep learning network classifier based on the received classification and the attributes of the plurality of training areas of interest. In another embodiment, the controller is configured to extract convolution layer filters of the deep learning network classifier. In another embodiment, the controller is configured to generate one or more difference filter recipes based on the extracted convolution layer filters.

A system is disclosed, in accordance with one or more embodiments of the present disclosure. In one embodiment, the system includes a controller. In another embodiment, the controller is configured to receive one or more training images of a specimen using a plurality of aperture settings, the one or more training images including a plurality of training areas of interest. In another embodiment, the controller is configured to receive a signal indicative of a classification of an aperture setting effectiveness metric for at least a portion of the plurality of aperture settings. In another embodiment, the controller is configured to generate a deep learning network classifier based on the received classification and the attributes of the plurality of training areas of interest. In another embodiment, the controller is configured to extract convolution layer filters of the deep learning network classifier. In another embodiment, the controller is configured to perform one or more mathematical analyses on the extracted convolution layer filters to generate one or more aperture setting recipes based on the extracted convolution layer filters. In another embodiment, the controller is configured to generate one or more aperture setting recipes based on the extracted convolution layer filters.

A method is disclosed, in accordance with one or more embodiments of the present disclosure. In one embodiment, the method includes: acquiring one or more training images of a specimen, the one or more training images including a plurality of training areas of interest; applying a plurality of difference filters to the one or more training images to generate one or more filtered training images; receiving a signal indicative of a classification of a difference filter effectiveness metric for at least a portion of the plurality of difference filters; generating a deep learning network classifier based on the received classification and the attributes of the plurality of training areas of interest; extracting convolution layer filters of the deep learning network classifier; generating one or more difference filter recipes based on the extracted convolution layer filters; and acquiring one or more product images of a specimen using at least one of the one or more difference filter recipes.

A method is disclosed, in accordance with one or more embodiments of the present disclosure. In one embodiment, the method includes: acquiring one or more training images of a first specimen using a plurality of aperture settings, the one or more training images including a plurality of training areas of interest; receiving a signal indicative of a classification of an aperture setting effectiveness metric for at least a portion of the plurality of aperture settings; generating a deep learning network classifier based on the received manual classification and the attributes of the plurality of training areas of interest; extracting convolution layer filters of the deep learning network classifier; performing one or more frequency domain analyses on the extracted convolution layer filters to generate one or more aperture setting recipes based on the extracted convolution layer filters; and acquiring one or more product images of a second specimen using at least one of the one or more aperture setting recipes.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Two important factors for efficient defect review and classification are the selection of difference filters, and the selection of aperture settings used during image acquisition (e.g., imaging aperture settings, return aperture settings). Current systems and methods for selection of aperture settings typically utilize "optics selector" software, in which a user selects a few defects or other areas of interest, and iteratively/exhaustively tests all possible aperture setting combinations. By exhaustively testing all possible combinations of imaging aperture settings and/or return aperture settings, a user may determine particular aperture settings which enhance a signal to noise ratio (SNR) for different types of defects, and minimizes a SNR for nuisance regions on a specimen. However, these iterative methods used to identify the best imaging aperture settings are often tedious and time consuming.

Similarly, current systems and methods for selection of difference filters utilize two different methods: (1) pre-selected difference filter recipes, and (2) "algorithm selector" software. Under the pre-selected difference filter recipe method, a user may attempt to enhance defect signals by selecting one of a set of pre-defined difference filters obtained through a recipe. Under the "algorithm selector" method, algorithm selector software may estimate a difference filter to be used. Both methods of difference filter selection are primarily manual and intuition-based, and may therefore be prone to error. Additionally, even if a selected difference filter is optimized for a particular type of defect, current methods may not select a difference filter which is optimized for multiple types of defects. Thus, current methods of difference filter selection may be incompatible with multi-mode imaging/detection.

Accordingly, embodiments of the present disclosure are directed to a system and method which address one or more of the shortfalls of previous approaches identified above. Embodiments of the present disclosure are directed to a system which utilizes deep learning for difference filter and aperture setting selection. Additional embodiments of the present disclosure are directed to a method of generating difference filter recipes and/or aperture setting recipes using a deep learning network classifier.

Figure 1:
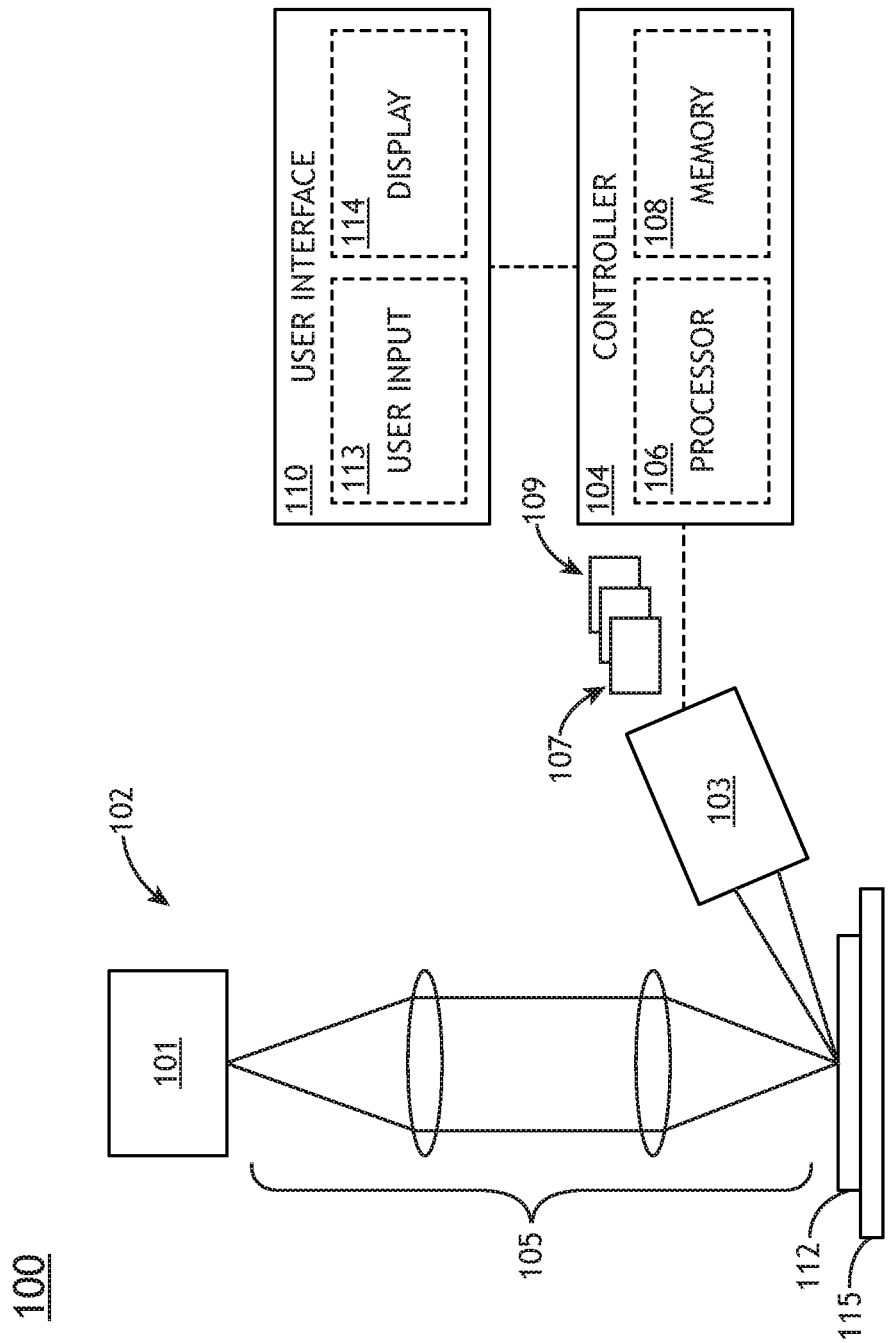
FIG. 1 illustrates a simplified block diagram of a system for defect review and analysis, in accordance with one or more embodiments of the present disclosure.

FIG. 1 illustrates a simplified block diagram of a system 100 for defect review and analysis, in accordance with one or more embodiments of the present disclosure. The system 100 may include, but is not limited to, an inspection sub-system 102, a controller 104, and a user interface 110.

In one embodiment, the inspection sub-system 102 is configured to acquire one or more images (e.g., training images 107, product images 109) of a specimen 112. The inspection sub-system 102 may be configured to inspect and/or measure one or more characteristics of one or more areas of interest disposed on the specimen 112. The specimen 112 may include any specimen known in the art including, but not limited to, a wafer, a semiconductor wafer, a reticle, a mask, and the like. In this regard, areas of interest may include, but are not limited to, defects, nuisance regions, and the like.

The inspection sub-system 102 may include any inspection configuration known in the art capable of defect review and classification. In one embodiment, as depicted in FIG. 1, the inspection sub-system 102 includes an e-beam defect review (EDR) tool. For example, inspection sub-system 102 may include a scanning electron microscope (SEM) inspection sub-system 102. For instance, as shown in FIG. 1, the inspection sub-system 102 may include an electron source 101 (e.g., one or more electron guns to emit one or more electron beams), a detector assembly 103 (e.g., secondary electron detector) and any one or more electron-optical components 105 known in the art for carrying out defect review.

It is noted herein that the scope of the present disclosure is not limited to the SEM configuration of system 100 or electron-beam review in general. In one embodiment, the inspection sub-system 102 may be configured as an optical inspection sub-system 102. For example, the inspection sub-system 102 may be configured to conduct inspection in any configuration including, but not limited to, a darkfield configuration, a brightfield configuration, and the like. In the case of light-based inspection, the inspection sub-system 102 may include one or more illumination sources 101 configured to illuminate the specimen 112. The illumination source 101 may include any illumination source 101 known in the art. For example, the illumination source 101 may include, but is not limited to, a narrow band light source (e.g., laser source). a broad band light source (e.g., discharge lamp, laser-sustained plasma (LSP) light source, and the like), and the like. In another embodiment, the illumination source 101 may be configured to direct light to the surface of the specimen 112. In this regard, in embodiments in which inspection sub-system 102 includes a light-based inspection sub-system, the inspection sub-system 102 may include one or more optical elements 105 configured to collect and/or direct illumination from the illumination source 101 to the specimen 101. Further, inspection sub-system 102 may also include additional optical elements configured to direct light reflected, scattered, and/or diffracted from the surface of the specimen 112 to the detector assembly 103.

The detector assembly 103 may include any detector known in the art. It is noted herein that the form of detector assembly 103 may vary depending on the type of inspection sub-system 102 being used (e.g., SEM inspection sub-system 102, light-based inspection sub-system 102, and the like). For example, in the case of an optical inspection sub-system 102, the detector assembly 103 may include, but is not limited to, a charge coupled device (CCD) detector, a complementary metal-oxide semiconductor (CMOS) detector, a time-delay integration (TDI) detector, a photomultiplier tube (PMT) detector, an avalanche photodiode (APD), and the like. By way of another example, in the case of an SEM-based inspection sub-system, the detector assembly 103 may include, but is not limited to a micro-channel plate (MCP), a PIN or p-n junction detector array (e.g., a diode array or avalanche photo diodes (APDs)), a photomultiplier tube (PMT) detector, and the like. Furthermore, in the case of an SEM-based inspection sub-system 102, the detector assembly 103 may include, but is not limited to, a secondary electron detector or a backscattered electron detector.

For purposes of simplicity, the inspection sub-system 102 has been depicted in a simplified block diagram. This depiction, including the components and geometrical configuration, is not limiting and is provided for illustrative purposes only. It is recognized herein that the inspection sub-system 102 may include any number of components (e.g., lenses, mirrors, filters, beam splitters, electron deflectors, and the like), electron/illumination sources (e.g., electron source 101, illumination source 101) and detectors (e.g., electron detector assembly 103, illumination detector assembly 103) to carry out the inspection of one or more portions of specimen 112 disposed on the sample stage 115.

The sample stage 115 of the inspection sub-system 102 may include any sample stage known in the art suitable for secure the specimen 112. In another embodiment, the sample stage 115 is an actuatable stage. For example, the sample stage 115 may include, but is not limited to, one or more translational stages suitable for selectably translating the specimen 112 along one or more linear directions (e.g., x-direction, y-direction and/or z-direction). By way of another example, the sample stage 115 may include, but is not limited to, one or more rotational stages suitable for selectively rotating the specimen 112 along a rotational direction. By way of another example, the sample stage 115 may include, but is not limited to, a rotational stage and a translational stage suitable for selectably translating the specimen 112 along a linear direction and/or rotating the specimen 112 along a rotational direction.

In another embodiment, the system 100 includes a controller 104. In one embodiment, the controller 104 is communicatively coupled to the inspection sub-system 102. For example, the controller 104 may be coupled to the detector assembly 103 of the inspection sub-system 102. In another embodiment, the controller 104 is configured to receive images (e.g., training images 107, product images 109) acquired by the inspection sub-system 102. In another embodiment, the controller 104 includes one or more processors 106 and a memory 108. In one embodiment, the one or more processors 106 are configured to execute a set of program instructions maintained in memory 108, wherein the program instructions are configured to cause the one or more processors 106 to carry out various steps of the present disclosure.

The one or more processors 106 of controller 104 may include any one or more processing elements known in the art. In this sense, the one or more processors 106 may include any microprocessor device configured to execute algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium (e.g., memory 108). Moreover, different subsystems of the system 100 (e.g., inspection sub-system 102, user interface 110, display 114, and the like) may include processor or logic elements suitable for carrying out at least a portion of the steps described throughout the present disclosure. Therefore, the above description should not be interpreted as a limitation on the present invention but merely an illustration.

The memory 108 may include any storage medium known in the art suitable for storing program instructions executable by the associated one or more processors 106. For example, the memory 108 may include a non-transitory memory medium. For instance, the memory 108 may include, but is not limited to, a read-only memory (ROM), a random access memory (RAM), a magnetic or optical memory device (e.g., disk), a magnetic tape, a solid state drive, and the like. In another embodiment, the memory 108 is configured to store one or more characteristics and/or images (e.g., training images 107, product images 109) received from the inspection sub-system 102 and/or the output of the various steps described herein. It is further noted that memory 108 may be housed in a common controller housing with the one or more processors 106. In an alternative embodiment, the memory 108 may be located remotely with respect to the physical location of the processors 106 and controller 104. For instance, the one or more processors 106 of controller 104 may access a remote memory (e.g., server), accessible through a network (e.g., internet, intranet and the like). In another embodiment, the memory medium 108 stores the program instructions for causing the one or more processors 106 to carry out the various steps described through the present disclosure.

In another embodiment, the controller 104 of the system 100 may be configured to receive and/or acquire data or information from other systems (e.g., inspection results from an inspection system or metrology results from a metrology system) by a transmission medium that may include wireline and/or wireless portions. In another embodiment, the controller 104 of the system 100 may be configured to transmit data or information (e.g., the output of one or more processes disclosed herein) to one or more systems or sub-systems (e.g., inspection system or metrology system) by a transmission medium that may include wireline and/or wireless portions. In this manner, the transmission medium may serve as a data link between the controller 104 and other subsystems of the system 100. Moreover, the controller 104 may send data to external systems via a transmission medium (e.g., network connection).

In another embodiment, the system 100 includes a user interface device 110. In one embodiment, the user interface device 110 is communicatively coupled to the one or more processors 106 of controller 104. In another embodiment, the user interface device 110 may be utilized by controller 104 to accept selections and/or instructions from a user. In some embodiments, described further herein, a display 114 may be used to display data of system 100 to a user. In turn, a user may input, via user input device 113, selections and/or instructions responsive to data displayed to the user via the display device 114.

The user interface device 110 may include any user interface known in the art. For example, the user input device 113 of the user interface 110 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like. In the case of a touchscreen interface device, those skilled in the art should recognize that a large number of touchscreen interface devices may be suitable for implementation in the present invention. For instance, the display device 114 may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device 113 may include, but is not limited to, a bezel mounted interface.

The display device 114 may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

It is noted herein that the one or more components of the disclosed system may be communicatively coupled to the various other components of the system in any manner known in the art. For example, the detector assembly 103, controller 104, user interface 110, and the like, may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 2:
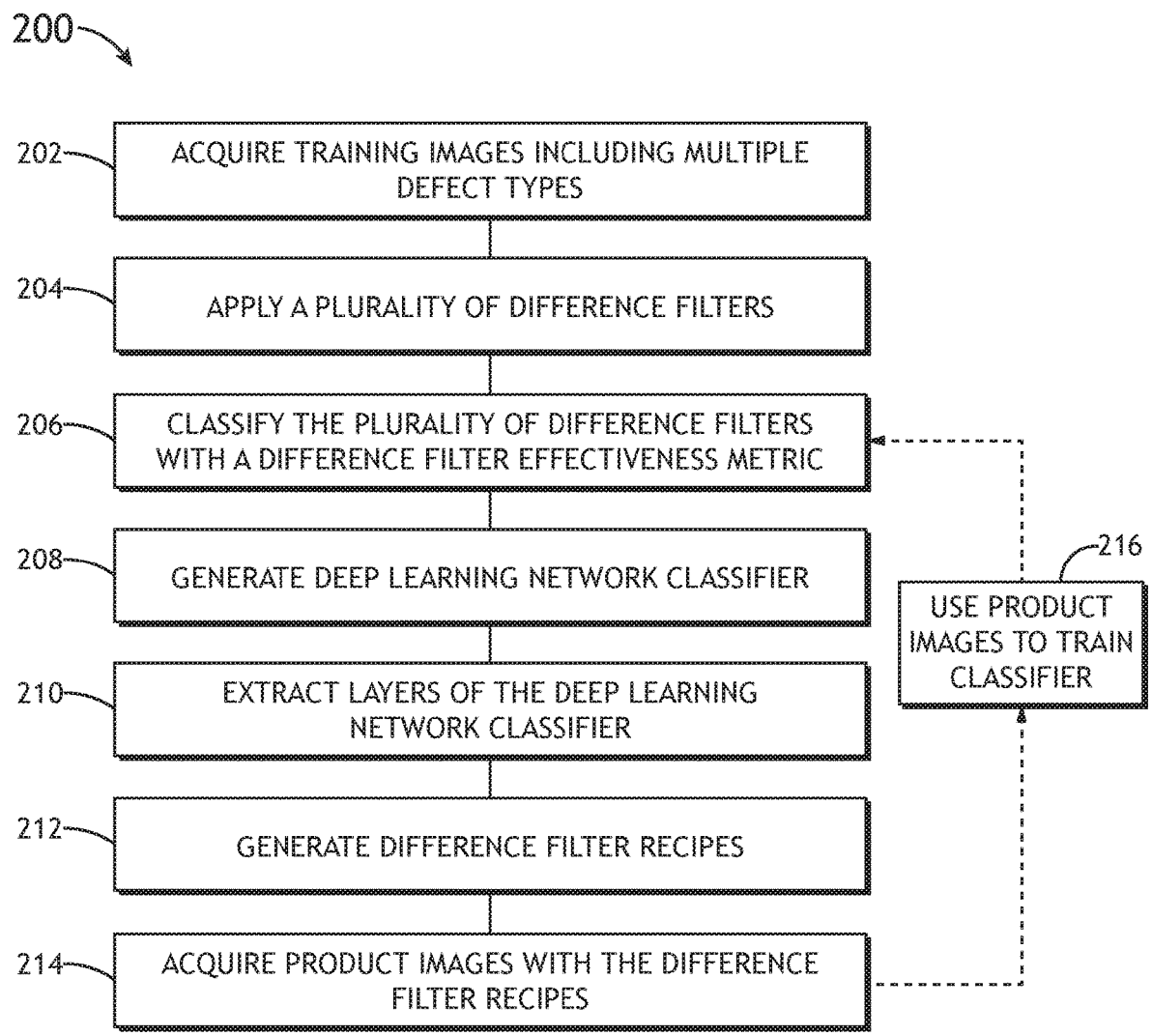
FIG. 2 illustrates a flowchart of a method for generating a difference filter recipe, in accordance with one or more embodiments of the present disclosure.

FIG. 2 illustrates a flowchart of a method 200 for generating a difference filter recipe, in accordance with one or more embodiments of the present disclosure. It is noted herein that the steps of method 200 may be implemented all or in part by system 100. It is further recognized, however, that the method 200 is not limited to the system 100 in that additional or alternative system-level embodiments may carry out all or part of the steps of method 200.

In a step 202, one or more training images of a specimen are acquired. For example, controller 104 is configured to cause the inspection sub-system 102 to acquire one or more training images 107 of at least a portion of the specimen 112. In embodiments, the one or more training images 107 include multiple training areas of interest on the specimen 112. The multiple training defects within the one or more training images 107 may include multiple types of areas of interest. As it is used herein, the term "areas of interest" may include any areas that are of interest when performing specimen imaging/characterization including, but not limited to, defects, nuisance regions, and the like. In the interests of simplicity much of the present disclosure is written in terms of characterizing defects in particular. However, this is not to be regarded as a limitation of the present disclosure, in that embodiments of the present disclosure may be applied to areas of interest which are in addition to, or in the alternate to, defects. In another embodiment, the controller 104 is configured to receive the one or more training images 107. In this regard, the controller 104 may be configured to acquire the one or more training images 107 from the detector assembly 103. In an additional and/or alternative embodiment, the detector assembly 103 is configured to transmit the one or more training images 107 to the controller 104. In another embodiment, the one or more processors 106 are configured to store the received training images 107 in memory 108.

In a step 204, a plurality of difference filters are applied to the one or more training images 107 to generate one or more filtered training images. For example, the one or more processors 106 of the controller 104 may be configured to apply a plurality of difference filters stored in memory 108 to the one or more training images 107. The plurality of difference filters stored in memory 108 and/or applied to the one or more training images 107 may be selected using any technique in the art. For instance, the plurality of difference filters applied to the one or more training images 107 may include pre-defined difference filters obtained through a recipe, as described previously herein. By way of anther example, the plurality of difference filters may be selected by one or more algorithm selector modules (e.g., algorithm selector software packages).

It is contemplated herein that the plurality of difference filters applied to the one or more training images 107 may encompass a wide range of difference filters with varying effectiveness levels. In this regard, it is contemplated herein that the plurality of difference filters may include a subset of difference filters which are relatively effective in imaging particular areas of interest (e.g., exhibit high SNR values for defects and/or low SNR values for nuisance regions). Similarly, it is contemplated that the plurality if difference filters may also include a subset of difference filters which are relatively ineffective in imaging particular areas of interest (e.g., exhibit low SNR values for defects and/or high SNR values for nuisance regions). In this regard, the one or more filtered training images may vary in image quality, wherein effective difference filters may generate higher quality filtered training images, and ineffective difference filters may generate lower quality filtered training images, and the like.

In one embodiment, at least a portion of the plurality of training defects are grouped. The plurality of training defects may be grouped into one of two or more groups of defects (e.g., types of defects) based on one or more attributes of the plurality of training defects. For example, the one or more processors 106 of the controller 104 may be configured to identify the plurality of training defects within the one or more training images 107. The one or more processors 106 may be further configured to group at least a portion of the plurality of defects into one of two or more groups such that like defects are grouped into the same group. Grouping defects is described generally in U.S. Pat. No. 9,922,269, issued on Mar. 20, 2018, which is incorporated by reference in the entirety.

The one or more attributes used for grouping training defects may include, but are not limited to, image feature amounts, defect coordinates, composition analysis results, manufacture initiation history data, or machine QC (Quality Control) data. Further, the one or more attributes may be obtained from multiple types of defect inspection tools or systems, such as, but not limited to, an optical or SEM foreign matter inspection machine, a pattern inspection machine, a defect review machine, SPM, or an elemental analysis machine. Attributes suitable for classification of defects is described in U.S. Pat. No. 7,602,962, issued on Oct. 13, 2009, which is incorporated herein by reference in the entirety.

In another embodiment, the one or more training images 107 may be recorded to a virtual inspector-virtual analyzer (VIVA) network. For example, the one or more processors 106 may be configured to provide the one or more training images 107 to a virtual inspector-virtual analyzer (VIVA) network.

In a step 206, the plurality of difference filters are classified with a difference filter effectiveness metric. The plurality of difference filters may be classified with a difference filter effectiveness metric based on one or more characteristics of the plurality of filtered training images. In one embodiment, classifying the plurality of difference filters includes receiving one or more signals indicative of a classification of a difference filter effectiveness metric for at least a portion of the plurality of difference filters. For example, a user may manually classify at least a portion of the plurality of difference filters. For instance, a user may input one or more input commands via the user input device 113, wherein the one or more input commands are configured to assign a difference filter metric to a difference filter.

As it is used throughout the present disclosure, the term "difference filter effectiveness metric" may be regarded as a metric indicative of how effective a difference filter is in imaging a particular area of interest. For example, if a first difference filter is effective in imaging a particular area of interest (e.g., exhibits high SNR values for defects and/or low SNR values for nuisance regions), the first difference filter may be classified with a high difference filter effectiveness metric. By way of another example, if a second difference filter is ineffective in imaging a particular area of interest (e.g., exhibits low SNR values for defects and/or high SNR values for nuisance regions), the second difference filter may be classified with a low difference filter effectiveness metric. In this regard, "high" difference filter effectiveness metrics may be regarded as corresponding to effective/efficient difference filters, whereas "low" difference filter effectiveness metrics may be regarded as corresponding to ineffective/inefficient difference filters.

It is noted herein that classifications according to difference filter effectiveness metrics may be carried out using any technique known in the art. For example, difference filter effectiveness metrics may include numerical rankings from 1 to 10, wherein a difference filter effectiveness metric of 1 indicates an ineffective difference filter, and a difference filter effectiveness metric of 10 indicates an effective difference filter. By way of another example, difference filter effectiveness metrics may be based on a binary scale, wherein a difference filter effectiveness metric of 0 indicates an ineffective difference filter, and a difference filter effectiveness metric of 1 indicates an effective difference filter. In this regard, it is contemplated herein that any ranking, categorizing, or classification system known in the art may be used, unless noted otherwise herein.

It is further difference filters may be classified according to their effectiveness as applied to each type (e.g., group) of defect. In this regard, classifying difference filters according to difference filter effectiveness metrics may, in effect, identify difference filters which are most productive for various types (e.g., groups) of areas of interest (e.g., defects, nuisance regions, and the like). For example, for a group of defects, a first difference filter may be classified with a first difference filter effectiveness metric of 10, and a second difference filter may be classified with a second difference filter effectiveness metric of 1. Comparing the two difference filter effectiveness metrics, it may be determined that the first difference filter is more effective in imaging that particular group of defects as compared to the second difference filter.

Conversely, it is further noted herein that a single difference filter may be classified with a first difference filter effectiveness metric for a first type (e.g., first group) of defects, and may be further classified with a second difference filter effectiveness metric for a second type (e.g., second group) of defects. For example, if a first difference filter were effective in imaging a first group of defects, a first difference filter may be classified with a first difference filter effectiveness metric of 10, indicating that the first difference filter is highly effective in imaging the first group of defects. Conversely, if the first difference filter were ineffective in imaging a second group of defects, the first difference filter may be classified with a second difference filter effectiveness metric of 1, indicating that the first difference filter is highly ineffective in imaging the second group of defects. Accordingly, by classifying difference filters according to their effectiveness in imaging areas of interest, the system of the present disclosure may not only identify which difference filters are most effective for each particular type of defect, but also identify which types of defect each difference filter is effective and/or ineffective with.

In another embodiment, the one or more processors 106 of controller 104 may be configured to generate and store in memory 108 a database which indicates possible difference filters and associated difference filter effectiveness metrics for the difference filters for each type (e.g., group) of defect. A user may be able to sort, filter, search, and view the database via the user input device 113 and the display 114.

In a step 208, a deep learning network classifier is generated. In one embodiment, the deep learning network classifier is generated, or trained, based on the received classifications (e.g., difference filter effectiveness metrics) and the attributes of the plurality of training defects (e.g., types/groups of training defects, and the like). For example, the one or more processors 106 of controller 104 may generate, or train, the deep learning network classifier and store the deep learning network classifier in memory 108. In some embodiments, the deep learning network classifier may include a shallow deep learning network classifier.

In a step 210, the convolution layer filters of the deep learning network classifier are extracted. For example, the one or more processors 106 of controller 104 may extract the convolution layer filters of the deep learning network classifier, and store the layers in memory 108. It is noted herein that, in embodiments where the deep learning network classifier includes a shallow deep learning network classifier, the one or more processors 106 may extract only a single convolution layer filter from the shallow deep learning network classifier.

In a step 212, one or more difference filter recipes are generated based on the extracted convolution layer filters. For example, the one or more processors 106 of the controller 104 may generate one or more difference filer recipes based at least partially on the extracted convolution layer filters. The one or more processors 106 may be further configured to store the one or more difference filter recipes in memory 108.

In a step 214, one or more product images of a specimen are acquired using at least one of the one or more difference filter recipes. For example, the one or more processors 106 of the controller 104 may be configured to cause the inspection sub-system 102 to acquire one or more product images 109 of the specimen 112 using at least one of the one or more difference filter recipes stored in memory 108. The one or more processors 106 may be further configured to store the one or more product images 109 in memory 108. As it is used herein, difference filter recipes may include imaging recipes which indicate difference filters which are to be used in order to optimize imaging of various types of areas of interest.

In another embodiment, the controller 104 is configured to cause the inspection sub-system 102 to acquire product images 109 of the specimen 112 using multiple difference filter recipes. For example, the controller 104 may be configured to cause the inspection sub-system 102 to use a first difference filter recipe for a first region of the specimen 112, and a second difference filter recipe for a second region of the specimen 112. In this regard, embodiments of the present disclosure may provide advantages of prior approaches in that system 100 may enable more efficient difference filter selection for multiple-mode inspection. Additionally, by automating the selection of difference filters through the use of a deep learning network classifier, concepts of the present disclosure may enhance detectability of areas of interest (e.g., defects, nuisance areas), and may optimize difference filter usage for all types of areas of interest by estimating difference filters from various optics modes. Furthermore, embodiments of the present disclosure may reduce and/or eliminate variability of inspection results due to manual selection of difference filters.

In a step 216, the one or more product images may be used to further train the deep learning network classifier. For example, the one or more processors 106 of the controller 104 may be configured classify the difference filters used for the one or more product images 109 with difference filter effectiveness metrics (Step 206), train the deep learning network classifier (Step 208), extract the convolution layer filters of the deep learning network classifier (Step 210), and generate one or more additional difference filter recipes (Step 212). It is contemplated herein that re-training a deep learning network classifier with product images 109 may facilitate further refinement of the deep learning network classifier, and may help generate more effective and efficient difference filter recipes.

In another embodiment, the controller 104 may be configured to adjust one or more process tools based on one or more characteristics of the product images 109 (e.g., characteristics of defects or nuisance regions within product images 109). For example, the controller 104 may be configured to adjust at least one of a lithography tool, implantation tool, polishing tool, fabrication tool, and the like, based upon one or more characteristics of the product images 109.

Figure 3:
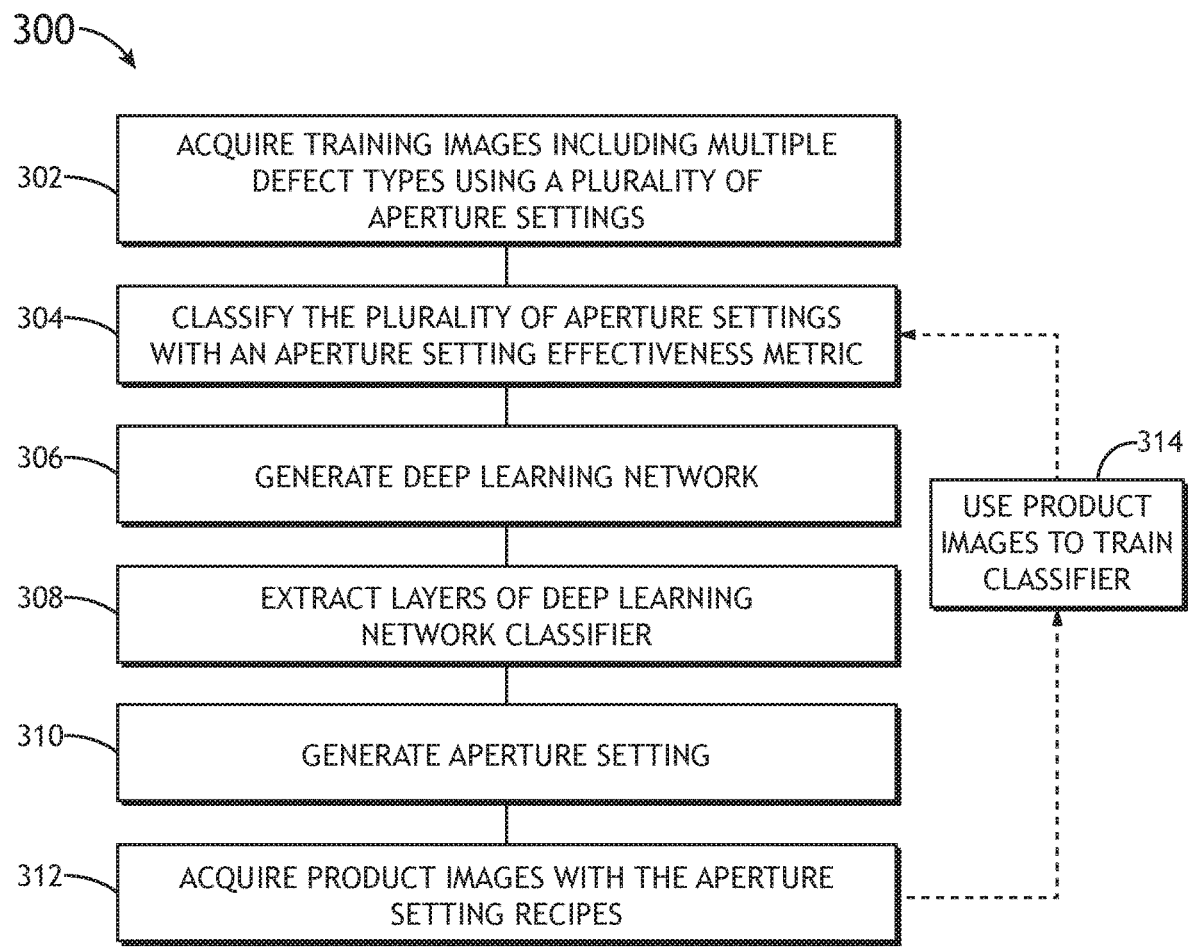
FIG. 3 illustrates a flowchart of a method for generating an aperture setting recipe, in accordance with one or more embodiments of the present disclosure.

FIG. 3 illustrates a flowchart of a method 300 for generating an aperture setting recipe, in accordance with one or more embodiments of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300. Additionally, it is noted herein that any description associated with method 200 depicted in FIG. 2 may be regarded as applying to method 300 depicted in FIG. 3 to the extent applicable, unless noted otherwise herein.

In a step 302, one or more training images of a specimen are acquired using a plurality of aperture settings. As it is used herein, the term "aperture settings" may refer to "imaging" aperture settings and/or "return path" aperture settings. It is noted herein that imaging aperture settings and return path aperture settings may be distinguished from "incident" aperture settings. In embodiments, the one or more training images 107 include multiple training defects on the specimen 112. The multiple training defects within the one or more training images 107 may include multiple defect types. In another embodiment, the controller 104 is configured to receive the one or more training images 107 and store the received training images 107 in memory 108.

In one embodiment, at least a portion of the plurality of training defects are grouped. The plurality of training defects may be grouped into one of two or more groups of defects (e.g., types of defects) based on one or more attributes of the plurality of training defects. For example, the one or more processors 106 of the controller 104 may be configured to identify the plurality of training defects within the one or more training images 107. The one or more processors 106 may be further configured to group at least a portion of the plurality of defects into one of two or more groups such that like defects are grouped into the same group.

In a step 304, the plurality of aperture settings are classified with an aperture setting effectiveness metric. The plurality of aperture settings may be classified with an aperture setting effectiveness metric based on one or more characteristics of the plurality of training images 107. In one embodiment, classifying the plurality of aperture settings includes receiving one or more signals indicative of a classification of an aperture setting effectiveness metric for at least a portion of the plurality of aperture settings. For example, a user may manually classify at least a portion of the plurality of aperture settings. For instance, a user may input one or more input commands via the user input device 113, wherein the one or more input commands are configured to assign an aperture setting effectiveness metric to an aperture setting. It is noted herein that any discussion associated with difference filter effectiveness metrics may be regarded as applying to aperture setting effectiveness metrics, unless noted otherwise herein.

In a step 306, a deep learning network classifier is generated. In one embodiment, the deep learning network classifier is generated, or trained, based on the received classifications (e.g., aperture setting effectiveness metrics) and the attributes of the plurality of training defects (e.g., types/groups of training defects, and the like). For example, the one or more processors 106 of controller 104 may generate, or train, the deep learning network classifier and store the deep learning network classifier in memory 108. In some embodiments, the deep learning network classifier may include a shallow deep learning network classifier.

In a step 308, the convolution layer filters of the deep learning network classifier are extracted. For example, the one or more processors 106 of controller 104 may extract the convolution layer filters of the deep learning network classifier, and store the layers in memory 108. It is noted herein that, in embodiments where the deep learning network classifier includes a shallow deep learning network classifier, the one or more processors 106 may extract only a single convolution layer filter from the shallow deep learning network classifier.

In a step 310, one or more aperture setting recipes are generated based on the extracted convolution layer filters.

For example, the one or more processors 106 of the controller 104 may generate one or more difference filer recipes based at least partially on the extracted convolution layer filters. In one embodiment, generating the one or more aperture setting recipes may include performing one or more frequency domain analyses on the extracted convolution layer filters to generate the one or more aperture setting recipes based on the extracted convolution layer filters. For example, performing one or more frequency domain analyses may include performing a Fourier analysis. For instance, the one or more processors 106 may be configured to perform a Fourier analysis on the extracted convolution layer filters to analyze the convolution layer filters in a frequency domain in order to obtain optimized illumination/detection aperture settings (e.g., generate aperture setting recipes).

In a step 312, one or more product images of a specimen are acquired using at least one of the one or more aperture setting recipes. For example, the one or more processors 106 of the controller 104 may be configured to adjust one or more characteristics of the inspection sub-system 102 based on the one or more aperture setting recipes (e.g., conform the inspection sub-system 102 to an aperture setting recipe). The controller 104 may be further configured to acquire one or more product images 109 of the specimen 112 using at least one of the one or more aperture setting recipes stored in memory 108. The one or more processors 106 may be further configured to store the one or more product images 109 in memory 108.

As noted previously herein, the controller 104 may be configured to cause the inspection sub-system 102 to acquire product images 109 of the specimen 112 using multiple aperture setting recipes. For example, the controller 104 may be configured to cause the inspection sub-system 102 to use a first aperture setting recipe for a first region of the specimen 112, and a second aperture setting recipe for a second region of the specimen 112. In embodiments where multiple aperture setting recipes are used for a single region of the specimen 112, the controller 104 may be configured to store and/or display product images 109 with the highest quality (e.g., taken with most efficient aperture setting recipe).

In a step 314, the one or more product images may be used to further train the deep learning network classifier. For example, the one or more processors 106 of the controller 104 may be configured to classify the aperture settings used for the one or more product images 109 with aperture setting effectiveness metrics (Step 304), train the deep learning network classifier (Step 306), extract the convolution layer filters of the deep learning network classifier (Step 308), and generate one or more additional aperture setting recipes (Step 310). It is contemplated herein that re-training a deep learning network classifier with product images 109 may facilitate further refinement of the deep learning network classifier, and may help generate more effective and efficient aperture setting recipes.

Figure 4:
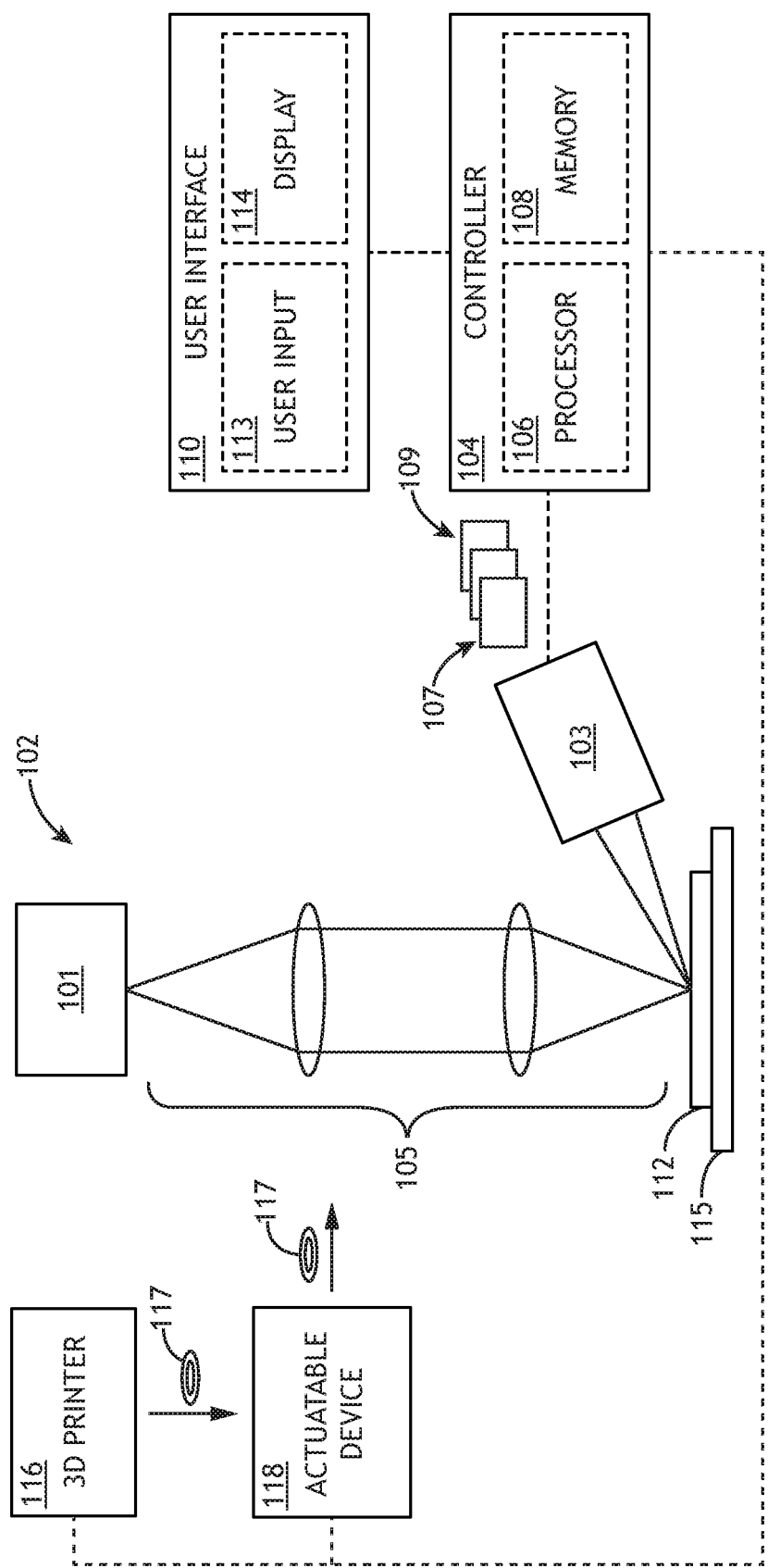
FIG. 4 illustrates a simplified block diagram of a system for defect review and analysis, in accordance with one or more embodiments of the present disclosure.

FIG. 4 illustrates a simplified block diagram of a system 100 for defect review and analysis, in accordance with one or more embodiments of the present disclosure. The system 100 may include, but is not limited to, an inspection sub-system 102, a controller 104, a user interface 110, a three-dimensional (3D) printer 116, and an actuatable device 118.

In one embodiment, the system 100 includes a 3D printer 116 communicatively coupled to the controller 104. In another embodiment, the 3D printer 116 is configured to fabricate/print one or more apertures 117 in response to one or more control signals received from the controller 104. The one or more control signals may be configured to cause the 3D printer 116 to fabricate one or more apertures 117 based on the one or more generated aperture setting recipes. For example, in step 310, the one or more processors 106 may generate one or aperture setting recipes. The one or more processors 106 may then be configured to generate one or more control signals configured to cause the 3D printer 116 to generate one or more apertures 117 based on the generated aperture setting recipes. The one or more apertures 117 generated by the 3D printer 116 may then be used to inspect/characterize additional specimens 112 (e.g., step 312). It is contemplated herein that a 3D printer 116 may allow for bespoke and "on the fly" aperture 117 fabrication in accordance with generated aperture setting recipes. It is further noted herein, however, that the materials used in the auto-generation of apertures 117 via 3D printer 116 must be carefully selected so as not to change and/or corrupt the optical paths of system 100 by causing distortions, creating artifacts on acquired images, and the like.

In another embodiment, system 100 includes an actuatable device 118 communicatively coupled to the controller 104. In one embodiment, the actuatable device 118 is configured to receive, handle, and/or transport apertures 117 within system 100. In this regard, actuatable device 118 may include any actuatable device configured to handle and transport apertures 117 and/or additional/alternative elements of system 100 including, but not limited to, a robotic arm. The actuatable device 118 (e.g., robotic arm 118) may be configured to actuate based on stored program instructions (e.g., programmable robotic arm 118), one or more control signals received from the controller 104, and the like. In one embodiment, the actuatable device 118 may be configured to retrieve apertures 117 and place apertures 117 in position within system 100. For example, the one or more processors 106 may generate one or more control signals configured to cause the actuatable device 118 to retrieve an aperture 117 fabricated by the 3D printer 116 and place the aperture 117 into its correct position within system 100.

Embodiments of the present disclosure are directed to a system and method for enhancing defect signals and reducing signal nuisance by using a deep learning network classifier to estimate difference filter recipes and/or aperture setting recipes. It is contemplated herein that the inventive concepts of the present disclosure may allow for more efficient selection of difference filters and aperture settings which will optimize image acquisition. Additional embodiments of the present disclosure are directed to the use of a deep learning network classifier to select difference filter recipes and/or aperture setting recipes in order to facilitate multi-mode inspection.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
    a controller including one or more processors configured to execute program instructions stored in memory, wherein the program instructions are configured to cause the one or more processors to:

receive one or more training images of a specimen, the one or more training images including a plurality of training areas of interest;

apply a plurality of difference filters to the one or more training images;

receive a signal indicative of a classification of a difference filter effectiveness metric for at least a portion of the plurality of difference filters;

generate a shallow deep learning network classifier based on the received classification and attributes of the plurality of training areas of interest;

extract a single convolution layer filter from the shallow deep learning network classifier; and generate one or more difference filter recipes based on the extracted single convolution layer filter, wherein the one or more difference filter recipes include a series of difference filters, wherein two or more of the difference filters are of different size to enhance detection of multiple defect-of-interest types when exposed to broadband illumination.

2. The system of claim 1, further comprising an inspection sub-system, wherein the controller is configured to receive at least one of the one or more training images or one or more product images from the inspection sub-system.

3. The system of claim 1, further comprising an inspection sub-system, wherein the inspection sub-system is configured to acquire one or more product images of at least a portion of a specimen using the one or more difference filter recipes.

4. The system of claim 3, wherein the inspection sub-system comprises a scanning electron microscope (SEM) inspection system.

5. The system of claim 3, wherein the inspection sub-system is configured to acquire one or more product images of at least a portion of a specimen using a first difference filter recipe for a first region of the portion of the specimen and an additional difference filter recipe for an additional region of the portion of the specimen.

6. The method of claim 1, wherein the receiving a signal indicative of a classification of a difference filter effectiveness metric for at least a portion of the plurality of difference filters comprises:

receiving a signal from a user interface device indicative of a manual classification of a difference filter effectiveness metric for at least a portion of the plurality of difference filters.

7. The system of claim 1, wherein the classification of the difference filter effectiveness metric for at least a portion of the plurality of difference filters comprises:

a first difference filter effectiveness metric for a first difference filter applied to a first group of areas of interest; and a second difference filter effectiveness metric for a second difference filter applied to the first group of areas of interest.

8. The system of claim 1, wherein the classification of the difference filter effectiveness metric for at least a portion of the plurality of difference filters comprises:

a first difference filter effectiveness metric for a first difference filter applied to a group of areas of interest; and a second difference filter effectiveness metric for the first difference filter applied to the group of areas of interest.

9. The system of claim 1, wherein the controller is further configured to record the one or more training images to a virtual inspector-virtual analyzer (VIVA) network.

10. The system of claim 1, wherein the plurality of training areas of interest include at least one of one or more defects or one or more nuisance regions.

11. A system, comprising:

a controller including one or more processors configured to execute program instructions stored in memory, wherein the program instructions are configured to cause the one or more processors to:

receive one or more training images of a specimen using a plurality of aperture settings, the one or more training images including a plurality of training areas of interest;

receive a signal indicative of a classification of an aperture setting effectiveness metric for at least a portion of the plurality of aperture settings;

generate a shallow deep learning network classifier based on the received classification and attributes of the plurality of training areas of interest;

extract a single convolution layer filter from the deep learning network classifier;

perform one or more mathematical analyses on the single convolution layer filter to generate one or more aperture setting recipes based on the extracted single convolution layer; and generate one or more aperture setting recipes based on the extracted single convolution layer filter, wherein the one or more aperture setting recipes include a series of aperture settings to enhance detection of multiple defect-of-interest types when exposed to broadband illumination.

12. The system of claim 11, further comprising an inspection sub-system, wherein the controller is configured to receive at least one of the one or more training images or one or more product images from the inspection sub-system.

13. The system of claim 11, further comprising an inspection sub-system, wherein the inspection sub-system is configured to acquire one or more product images of at least a portion of a specimen using the one or more aperture setting recipes.

14. The system of claim 13, wherein the inspection sub-system comprises a scanning electron microscope (SEM) inspection system.

15. The system of claim 13, wherein the inspection sub-system is configured to acquire one or more product images of at least a portion of a specimen using a first aperture setting recipe for a first region of the portion of the specimen and an additional aperture setting recipe for an additional region of the portion of the specimen.

16. The system of claim 11, wherein the receiving a signal indicative of a classification of an aperture setting effectiveness metric for at least a portion of the plurality of aperture settings comprises:

receiving a signal from a user interface device indicative of a manual classification of an aperture setting effectiveness metric for at least a portion of the plurality of aperture settings.

17. The system of claim 11, wherein the classification of the aperture setting effectiveness metric for at least a portion of the plurality of aperture settings comprises:

a first aperture setting effectiveness metric for a first aperture setting applied to a first group of areas of interest; and a second aperture setting effectiveness metric for a second aperture setting applied to the first group of areas of interest.

18. The system of claim 11, wherein the classification of the aperture setting effectiveness metric for at least a portion of the plurality of aperture settings comprises:
   a first aperture setting effectiveness metric for a first aperture setting applied to a group of areas of interest; and
   a second aperture setting effectiveness metric for the aperture setting filter applied to the group of areas of interest.

19. The system of claim 11, wherein the controller is further configured to record the one or more training images to a virtual inspector-virtual analyzer (VIVA) network.

20. The system of claim 11, wherein the one or more mathematical analyses comprises a Fourier analysis.

21. The system of claim 11, wherein the plurality of training areas of interest include at least one of one or more defects or one or more nuisance regions.

22. A method, comprising:
   acquiring one or more training images of a specimen, the one or more training images including a plurality of training areas of interest;
   applying a plurality of difference filters to the one or more training images to generate one or more filtered training images;
   receiving a signal indicative of a classification of a difference filter effectiveness metric for at least a portion of the plurality of difference filters;
   generating a shallow deep learning network classifier based on the received classification and attributes of the plurality of training areas of interest;
   extracting a single convolution layer filter from the shallow deep learning network classifier;
   generating one or more difference filter recipes based on the extracted single convolution layer filter, wherein the one or more difference filter recipes include a series of difference filters, wherein two or more of the difference filters are of different size to enhance detection of multiple defect-of-interest types when exposed to broadband illumination; and
   acquiring one or more product images of a specimen using at least one of the one or more difference filter recipes.

23. The method of claim 22, wherein the receiving a signal indicative of a classification of a difference filter effectiveness metric for at least a portion of the plurality of difference filters comprises:
   receiving a signal from a user interface device indicative of a manual classification of a difference filter effectiveness metric for at least a portion of the plurality of difference filters.

24. The method of claim 22, wherein the classification of the difference filter effectiveness metric for at least a portion of the plurality of difference filters comprises:
   a first difference filter effectiveness metric for a first difference filter applied to a first group of areas of interest; and
   a second difference filter effectiveness metric for a second difference filter applied to the first group of areas of interest.

25. The method of claim 22, wherein the classification of the difference filter effectiveness metric for at least a portion of the plurality of difference filters comprises:
   a first difference filter effectiveness metric for a first difference filter applied to a group of areas of interest; and
   a second difference filter effectiveness metric for the first difference filter applied to the group of areas of interest.

26. The method of claim 22, wherein the one or more training images comprise one or more scanning electron microscope (SEM) images.

27. The method of claim 22, wherein the method further comprises recording the one or more training images to a virtual inspector-virtual analyzer (VIVA) network.

28. The method of claim 22, wherein acquiring one or more product images of a specimen using at least one of the one or more difference filter recipes comprises:
   acquiring one or more product images of a specimen using a first difference filter recipe for a first region of the specimen, and an additional difference filter recipe for an additional region of the specimen.

29. The method of claim 22, wherein the plurality of training areas of interest include at least one of one or more defects or one or more nuisance regions.

30. A method, comprising:
   acquiring one or more training images of a first specimen using a plurality of aperture settings, the one or more training images including a plurality of training areas of interest;
   receiving a signal indicative of a classification of an aperture setting effectiveness metric for at least a portion of the plurality of aperture settings;
   generating a deep learning network classifier based on the received manual classification and attributes of the plurality of training areas of interest;
   extracting a single convolution layer filter from the deep learning network classifier;
   performing one or more frequency domain analyses on the extracted single convolution layer filter to generate one or more aperture setting recipes based on the extracted single convolution layer filter, wherein the one or more aperture setting recipes include a series of aperture settings to enhance detection of multiple defect-of-interest types when exposed to broadband illumination; and
   acquiring one or more product images of a second specimen using at least one of the one or more aperture setting recipes.

31. The method of claim 30, wherein the receiving a signal indicative of a classification of an aperture setting effectiveness metric for at least a portion of the plurality of aperture settings comprises:
   receiving a signal from a user interface device indicative of a manual classification of an aperture setting effectiveness metric for at least a portion of the plurality of aperture settings.

32. The method of claim 30, wherein the classification of the aperture setting effectiveness metric for at least a portion of the plurality of aperture settings comprises:
   a first aperture setting effectiveness metric for a first aperture setting applied to a first group of areas of interest; and
   a second aperture setting effectiveness metric for a second aperture setting applied to the first group of areas of interest.

33. The method of claim 30, wherein the classification of the aperture setting effectiveness metric for at least a portion of the plurality of aperture settings comprises:
   a first aperture setting effectiveness metric for a first aperture setting applied to a group of areas of interest; and
   a second aperture setting effectiveness metric for the first aperture setting applied to the group of areas of interest.

34. The method of claim 30, wherein the one or more training images comprise one or more scanning electron microscope (SEM) images.

35. The method of claim 30, wherein the method further comprises recording the one or more training images to a virtual inspector-virtual analyzer (VIVA) network.

36. The method of claim 30, wherein the acquiring one or more product images of a specimen using at least one of the one or more aperture setting recipes comprises:
    acquiring one or more product images of a specimen using a first aperture setting recipe for a first region of the specimen, and an additional aperture setting recipe for an additional region of the specimen.

37. The method of claim 30, wherein the plurality of training areas of interest include at least one of one or more defects or one or more nuisance regions.

38. The method of claim 30, wherein the one or more frequency domain analyses include a Fourier analysis.

\* \* \* \* \*